US012597941B2

(12) United States Patent
Zhang et al.

(10) Patent No.: US 12,597,941 B2
(45) Date of Patent: Apr. 7, 2026

(54) DELAY CALIBRATION CIRCUIT AND METHOD, ANALOG-TO-DIGITAL CONVERTER, RADAR SENSOR, AND DEVICE

(71) Applicant: CALTERAH SEMICONDUCTOR TECHNOLOGY (SHANGHAI) CO., LTD., Shanghai (CN)

(72) Inventors: Xinlong Zhang, Shanghai (CN); Wenting Zhou, Shanghai (CN)

(73) Assignee: Calterah Semiconductor Technology (Shanghai) Co., Ltd., Shanghai (CN)

( * ) Notice: Subject to any disclaimer, the term of this patent is extended or adjusted under 35 U.S.C. 154(b) by 308 days.

(21) Appl. No.: 18/363,631

(22) Filed: Aug. 1, 2023

(65) Prior Publication Data

US 2023/0387931 A1    Nov. 30, 2023

Related U.S. Application Data

(63) Continuation of application No. PCT/CN2023/087073, filed on Apr. 7, 2023.

(30) Foreign Application Priority Data

May 24, 2022    (CN) .......................... 202210566799.5

(51) Int. Cl.
*H03M 1/10*        (2006.01)
*G01S 7/35*        (2006.01)
*G01S 7/40*        (2006.01)
(52) U.S. Cl.
CPC ........... *H03M 1/1009* (2013.01); *G01S 7/352* (2013.01); *G01S 7/4021* (2013.01)

(58) Field of Classification Search
None
See application file for complete search history.

(56) References Cited

U.S. PATENT DOCUMENTS

| | | | |
|---|---|---|---|
| 9,660,664 | B1 | 5/2017 | Price et al. |
| 11,271,577 | B1 | 3/2022 | Hu et al. |

(Continued)

FOREIGN PATENT DOCUMENTS

| | | |
|---|---|---|
| CN | 104967451 A | 10/2015 |
| CN | 106537786 A | 3/2017 |

(Continued)

OTHER PUBLICATIONS

Calterah Semiconductor Technology (shanghai) Co.,Ltd., International Search Report with English translation, PCT/CN2023/087073, Jun. 14, 2023, 5 pgs.

(Continued)

*Primary Examiner* — Whitney Moore
(74) *Attorney, Agent, or Firm* — USCH Law, PC

(57) ABSTRACT

A delay calibration circuit and method, an analog-to-digital converter, a radar sensor, and a device are provided. The delay calibration circuit monitors a timing relationship between signals in a chip in real time to extract PVT information, dynamically adjusts conversion timing of an asynchronous SAR ADC, maximally utilizes an available conversion time in each cycle of the asynchronous SAR ADC, improves the robustness of the asynchronous SAR ADC, and does not affect the normal operation of the asynchronous SAR ADC.

20 Claims, 6 Drawing Sheets

(56) References Cited

U.S. PATENT DOCUMENTS

| | | | | |
|---|---|---|---|---|
| 2016/0094239 A1* | 3/2016 | Fujiwara | ............... | H03K 5/133 |
| | | | | 341/161 |
| 2022/0149858 A1* | 5/2022 | Menkus | ............... | H03M 1/125 |

FOREIGN PATENT DOCUMENTS

| | | | | | |
|---|---|---|---|---|---|
| CN | 106972861 | A | 7/2017 | | |
| CN | 110798211 | A | 2/2020 | | |
| CN | 111740739 | A | 10/2020 | | |
| CN | 112260689 | A | 1/2021 | | |
| CN | 113055006 | A | 6/2021 | | |
| CN | 113508535 | A | 10/2021 | | |
| CN | 114142858 | A | 3/2022 | | |
| CN | 114826264 | A | 7/2022 | | |
| WO | WO-2020239835 | A1 * | 12/2020 | .......... | G11C 27/026 |
| WO | 2023131360 | A1 | 7/2023 | | |

OTHER PUBLICATIONS

Calterah Semiconductor Technology (Shanghai) Co., Ltd., European Search Report, EP23737222.2, Jul. 25, 2025, 13 pgs.

* cited by examiner

Vin

410

420

430

$T_{cmp}$ $T_{dac}$          $T_{logic}$

440

$T_{cmp}$

CMP

SAR
Logic $T_{logic}$

DAC $T_{dac}$ $Start_n$ $Ready_n$          $T_{delay}$ $Start_{n+1}$

DELAY CALIBRATION CIRCUIT AND METHOD, ANALOG-TO-DIGITAL CONVERTER, RADAR SENSOR, AND DEVICE

CROSS REFERENCE TO RELATED APPLICATIONS

This application is a continuation of PCT Patent Application No. PCT/CN2023/087073, filed Apr. 7, 2023, which claims priority to Chinese Patent Application No. CN202210566799.5, filed on May 24, 2022, each of which is hereby incorporated by reference in its entirety.

TECHNICAL FIELD

The various embodiments described in this document relate in general to the technical field of integrated circuits, and more specifically to a delay calibration circuit and method, an analog-to-digital converter, a radar sensor, and a device.

BACKGROUND

The successive approximation register (SAR) analog-to-digital converter (ADC) is disposed inside a semiconductor chip and configured to convert an input analog voltage value into a digital code. The SAR ADCs are widely used in electronic devices with low-power consumption because the SAR ADC is relatively short in sampling delay time, good in conversion rate and accuracy, simple in structure, low in power consumption, and easy to be compatible with digital circuits. To achieve ultra-high-speed ADC while maintaining relatively low energy consumption, a relatively high sampling rate needs to be achieved in a single channel to reduce the number of interleaved channels and wiring complexity.

SUMMARY

To solve above technical problems, according to a first aspect of embodiments of the present disclosure, a delay calibration circuit is provided and is arranged within a SAR analog-to-digital converter, (ADC), where the SAR ADC is configured to convert an analog signal sampled in a present sampling cycle into a digital signal of N bits, N>1; where the delay calibration circuit includes: a monitoring circuit unit, configured to monitor a completion time of the analog signal being converted in the present sampling cycle and to output a detection signal in response to a last bit of the N bits having been generated in the present sampling cycle; and an adjustable delay calibration circuit unit coupled with the monitoring circuit and configured to adjust at least one delay duration according to timing information between the detection signal and a sampling clock signal of a next sampling cycle, where each delay duration of the at least one delay duration corresponds to a length of time spent by the SAR ADC to generate a corresponding bit in the next sampling cycle.

According to a second aspect of embodiments of the disclosure, a signal receiving device is provided and includes a mixer configured to mix a radio frequency receiving signal with a radio frequency reference signal to output an intermediate frequency signal; and an analog-to-digital converter (ADC) configured to convert the intermediate frequency signal into a digital signal and to output the digital signal, where the ADC includes the delay calibration circuit described in the first aspect for generating a digital signal in a corresponding sampling cycle based on each delay duration adjusted by the delay calibration circuit within at least one sampling cycle.

According to a third aspect of embodiments of the disclosure, a radar sensor is provided and includes an antenna device including a transmitting antenna and a receiving antenna; a signal transmitting device configured to process a reference signal generated by a signal source into a radio frequency transmitting signal and to transmit the radio frequency transmitting signal through the transmitting antenna; and the signal receiving device described in the second aspect, where the radio frequency receiving signal received by the signal receiving device is obtained after an electromagnetic wave emitted by the transmitting antenna is reflected by an object and converted by the receiving antenna.

According to a fourth aspect of embodiments of the disclosure, an electronic device is provided and includes the radar sensor described in the third aspect; and a signal processing device coupled to the radar sensor, and configured to perform signal processing on a digital signal output from the radar sensor, to detect targets in a surrounding environment.

According to a fifth aspect of embodiments of the disclosure, a delay calibration method is provided and includes: monitoring a completion time of an analog signal sampled in a present sampling cycle being converted into a digital signal of N bits, where N>1; outputting a detection signal in response to a last bit of the N bits having been generated in the present sampling cycle; and adjusting at least one delay duration according to timing information between the detection signal and a sampling clock signal of a next sampling cycle, where each delay duration of the at least one delay duration corresponds to a length of time spent by the SAR analog-to-digital converter (ADC) to generate a corresponding bit in the next sampling cycle.

According to a sixth aspect of embodiments of the disclosure, an analog-to-digital converter (ADC) is provided and configured to convert an analog signal received into a digital signal in a present sampling cycle, where the ADC includes: the delay calibration circuit described in any aspect to adjust a length of time spent for generating each bit of the digital signal in a next sampling cycle.

BRIEF DESCRIPTION OF THE DRAWINGS

In order to explain technical solutions of embodiments of the present disclosure more clearly, accompanying drawings required to be used in the description of the embodiments will be briefly introduced below. It will be obvious that the accompanying drawings described below are merely some embodiments of the present disclosure, and other embodiments can be obtained from these drawings without creative effort for those of ordinary skill in the art.

DETAILED DESCRIPTION OF THE EMBODIMENTS

Figure 1A:
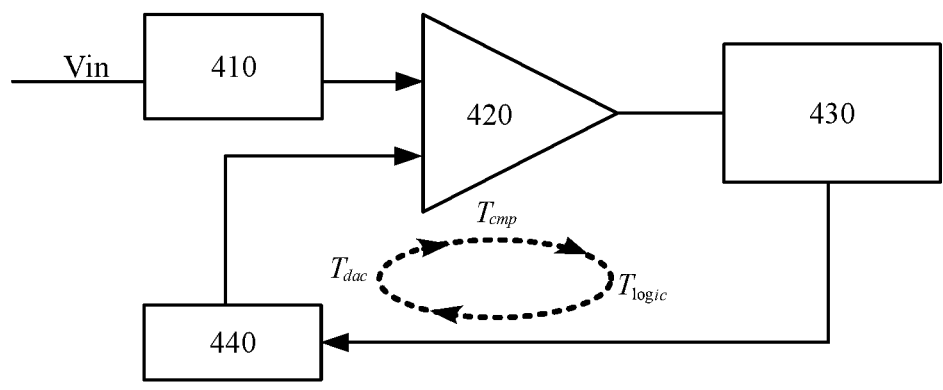
FIG. 1A is a schematic structural diagram of a SAR ADC according to embodiments of the present disclosure.

For ease of understanding the disclosure, a more complete description of the disclosure will be given below with reference to the associated accompanying drawings. Preferred embodiments of the present disclosure are given in the accompanying drawings. However, the present disclosure may be embodied in many different forms and is not limited to the embodiments described herein. Rather, these embodiments are provided for a more thorough understanding of the disclosure of the present disclosure.

Unless otherwise defined, all technical and scientific terms used herein have the same meaning as would normally be understood by those skilled in the art of the present disclosure. Terms used in the specification of this disclosure are for the purpose of describing specific embodiments only and are not intended to limit the application. The term "and/or" as used herein includes any combination and all combinations of one or more related listed items.

In the case of "including", "having", and "containing" as described herein, another part may be added unless explicit qualifying terms are used, such as "only", "consisting of", etc. Unless mentioned to the contrary, terms in the singular form may include the plural form and should not be understood as only one.

It shall be understood that although the terms "first", "second" and the like may be used in this disclosure to describe various elements, these elements should not be limited by these terms. These terms are used only to distinguish one component from another. For example, without departing from the scope of the present disclosure, the first element may be referred to as a second element and similarly, the second element may be referred to as a first element.

In this disclosure, unless otherwise expressly specified and limited, the terms "connected/connecting", "coupled/coupling" and the like are understood in a broad sense and may, for example, be directly connected or indirectly connected through an intermediary, or may be interconnected within two elements or in an interacting relationship between two elements. For those of ordinary skill in the art, the specific meanings of the above terms in the present disclosure may be understood based on specific circumstances.

In view of the above, it is necessary to provide a delay calibration circuit and method, an analog-to-digital converter, a radar sensor, and a device, to solve the problems in the background technology, to monitor timing relationship between the signals in the chip in real time to extract PVT information, to dynamically adjust conversion timing of the asynchronous SAR ADC, to maximize an available conversion time in each cycle of the asynchronous SAR ADC, and to improve the robustness of the asynchronous SAR ADC without affecting the normal operation of the asynchronous SAR ADC.

According to embodiments of the present disclosure, a completion time represented by the delay signal corresponding to the last bit of SAR ADC in the present sampling cycle is monitored without affecting the normal operation of SAR logic circuit; and the detection signal is generated based on the delay signal. According to timing information between the received detection signal and the sampling clock signal of the next sampling cycle, the delay duration of each of a plurality of bits in the next sampling cycle of the SAR ADC are adjusted. In this way, it is possible to improve the robustness of asynchronous SAR ADC while meeting the timing requirements of SAR ADC. In addition, cost and risk are reduced, and the design difficulty is reduced.

An operating timing of a successive approximation register (SAR) analog-to-digital converter (ADC) includes a synchronous operating timing and asynchronous operating timing. During performing of multi-bit digital signal conversion on potentials of a sampled signal by synchronous SAR ADC, conversion operation process of the synchronous SAR ADC is controlled by a unified clock, and a time required for synchronous quantization of each bit needs to match a slowest bit comparison process. In the asynchronous SAR ADC, a quantization time of a single bit is equivalent to an average single-bit quantization time of all bits. Compared with synchronous SAR ADC, a sampling rate obtained by the asynchronous SAR ADC is relatively faster, i.e., a completion rate of quantization of all bits is relatively fast.

As shown in FIG. 1A, for example, the SAR ADC mainly includes a sample-and-hold circuit 410, a comparator 420, a SAR logic circuit 430, and a feedback circuit 440 including a digital-to-analog converter (DAC).

In addition, Vin shown in FIG. 1A is an analog signal received at an input terminal of the SAR ADC.

In one sampling cycle, execution processes of internal circuits of the SAR ADC are as follows. When the comparator completes comparison, a comparison result and a Ready signal are output, where the output Ready signal is equal to 1. Thereafter, the SAR logic circuit controls the DAC in the feedback circuit to adjust a reference voltage output from the DAC according to a current comparison result. When the DAC outputs a stable reference voltage, a next bit comparison process is started. The Ready signal is configured to indicate that the comparator outputted the comparison result. A time $T_{delay}$ required for outputting the comparison result by the comparator to outputting the stable voltage by the DAC indicates a delay time (also known as a delay duration) required for completion of conversion of a current bit. $T_{delay}$ is substantially equal to $(T_{logic}+T_{dac})$. $T_{logic}$ represents a time taken by the SAR logic circuit to output a control signal for controlling the feedback circuit according to the comparison result of the comparator, and $T_{dac}$ represents a time taken by the DAC in the feedback circuit to adjust the reference voltage output by the DAC.

Taking the timing diagram shown in FIG. 1B as an example, when a n-th comparison process is performed in a sampling cycle, the SAR ADC circuit is executed as follows. When a value of a start signal $Start_n$ of the n-th comparison process is 1, the comparator starts comparison for the current bit. The comparator (for a schematic timing of a signal of the comparator, reference may be made to a timing of a CMP signal shown in FIG. 1B) takes time $T_{CMP}$ to perform comparison to obtain and output the comparison result. After the comparator obtains the comparison result, a Ready signal Ready$_n$ of the current comparison is set to 1. Thereafter, the SAR logic circuit (for a schematic timing of a signal of the SAR logic circuit, reference may be made to the timing of the SAR logic signal shown in FIG. 1B) takes time $T_{logic}$ to determine a control signal for controlling the feedback circuit based on the received comparison result and to output the control signal to the feedback circuit. The feedback circuit (for a schematic timing of a signal of the feedback circuit, reference may be made to the timing of the DAC signal shown in FIG. 1B) takes time $T_{dac}$ to adjust an output voltage to be in a stable state under the control of the control signal output by the SAR logic circuit. After the output voltage of the feedback circuit is in the stable state, a start signal Start$_{n+1}$ of a (n+1)-th comparison process is set to 1, which is used for indicating the start of a next comparison process.

Figure 1B:
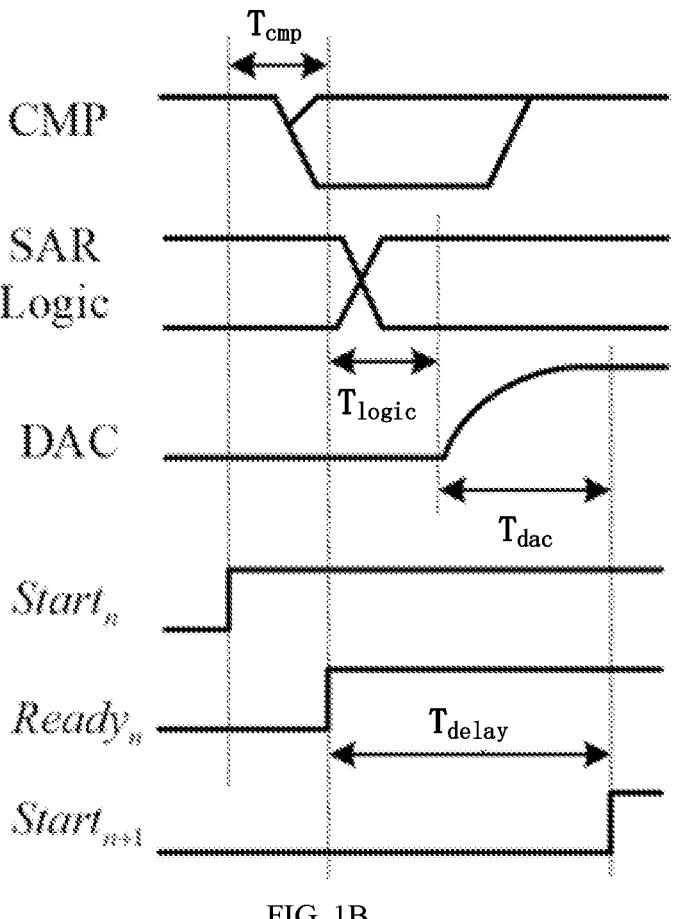
FIG. 1B is a schematic diagram of an operating timing of a SAR ADC according to embodiments of the present disclosure.

As shown in FIG. 1B, the time $T_{delay}$ required for outputting the comparison result by the comparator to outputting the stable voltage by the feedback unit, i.e., the time for the Ready signal to remain at 1, is approximately equivalent to $T_{logic}+T_{dac}$.

In the comparator example described above, the comparator can generate a Ready signal. In other examples, the comparator does not generate a Ready signal, the time $T_{delay}$ may be set based on other signals such as a Start$_n$ signal, to determine a length of time required to generate a corresponding bit of a digital signal.

The time $T_{delay}$ required for completing a process of outputting the comparison result by the comparator to outputting the stable voltage by the DAC one time in the SAR ADC greatly varies under different process, voltage, and temperature (PVT) parameters. For example, in some asynchronous SAR ADCs, when the number of buffers is set in advance according to poor PVT parameters (in this case, the required delay time $T_{delay}$ is generally the largest), it is easy to have the phenomenon that the delay time is too large when the PVT parameters are improved. Similarly, when the number of buffers is set in advance according to relatively good PVT parameters (in this case, the required delay time $T_{delay}$ is generally small), it is easy to have the phenomenon that the delay time is too short when the PVT parameters become worse. The above may lead to the incomplete establishment of the output voltage of the DAC, which may affect accuracy of a next comparison result output from the comparator and cause the deviation of the accuracy of bit quantization of the SAR ADC. When the PVT parameters change, it is difficult for the delay unit to ensure that the generated delay time matches a delay time required for comparison of each bit, which makes the performance of the SAR ADC fluctuate greatly under different PVT parameters.

Therefore, embodiments of the present disclosure provide a delay calibration circuit and method, an analog-to-digital converter, a radar sensor, and a device, which can monitor in real time a delay of analog-to-digital conversion of a successive approximation register (SAR) analog-to-digital converter (ADC) under different PVT parameters and perform delay adjustment in a next sampling cycle, thereby improving robustness of the asynchronous SAR ADC.

Figure 2A:
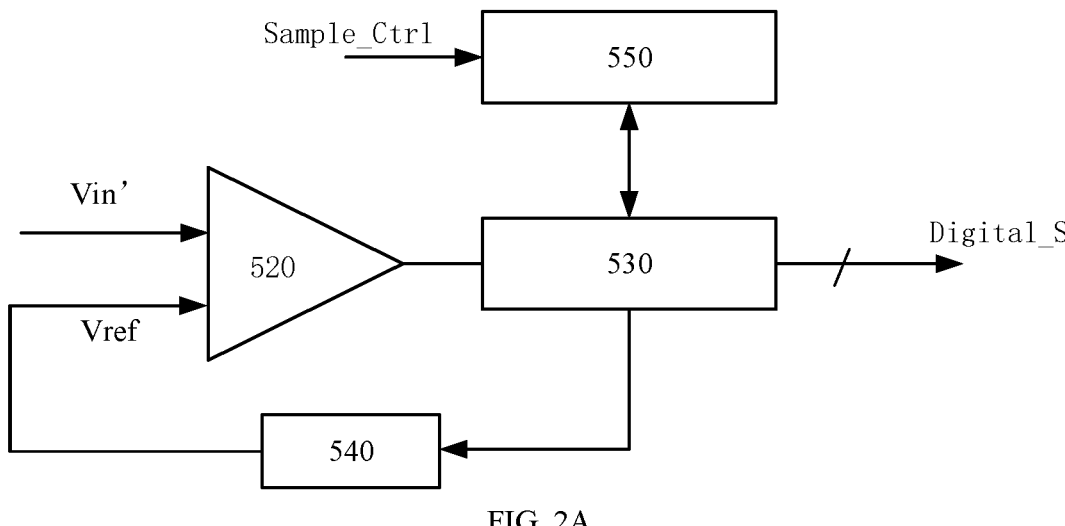
FIG. 2A, FIG. 2B, and FIG. 2C are schematic structural diagrams of an ADC according to embodiments of the present disclosure.

As shown in FIG. 2A, the SAR ADC includes a comparator 520, a SAR logic circuit 530 (also referred to as a bit-by-bit approximation logic circuit or a logic circuit in abbreviation), a feedback circuit 540, and a delay calibration circuit 550. The delay calibration circuit 550 is coupled to the SAR logic circuit 530. For example, the delay calibration circuit and the SAR logic circuit are integrated in a chip.

The comparator 520 is configured to receive an analog signal Vin' obtained by sampling (sampled analog signal Vin') in a sampling cycle and a reference signal Vref to compare the two signals and output a comparison result. The analog signal Vin' is an analog signal obtained by performing sample-held on an analog signal Vin input to an input terminal of the SAR ADC.

The SAR logic circuit 530 forms a loop circuit with the comparator 520 and the feedback circuit 540. The SAR logic circuit 530 uses the feedback circuit 540 and a comparison circuit (i.e., the comparator 520 described above) to perform bit-by-bit logic processing on the sampled analog signal Vin' in the sampling cycle to achieve digital conversion of a corresponding bit within each delay duration $T_{delay}$ provided by the delay calibration circuit 550. Each delay duration $T_{delay}$ corresponds to one processed bit. The SAR logic circuit 530 performs bit-by-bit processing in the sampling cycle according to a generation order of bits to output a digital signal of N bits (N-bit digital signal) Digital_S, N>1. The N-bit digital signal Digital_S is used to describe the sampled analog signal Vin' in the sampling cycle.

For example, with the asynchronous operation timing as described above, when the SAR logic circuit 530 performs logic processing of each bit on each comparison result, the SAR logic circuit 530 generates a corresponding bit of the digital signal. During a sampling cycle, the SAR logic circuit 530 may perform logic processing multiple times to obtain the digital signal Digital_S for describing the sampled analog signal Vin'. As previously described, it generally takes a different length of time to generate the corresponding bit of the digital signal each time within the sampling cycle, which is referred to as an asynchronous operation. The delay calibration circuit is configured to provide a corresponding delay signal, such as signal Start$_n$, or signal Ready$_n$, for each asynchronous operation of the SAR logic circuit within sampling cycle.

The feedback circuit is coupled between the SAR logic circuit and the comparator, and is configured to generate a corresponding reference signal Vref according to a comparison result output from the comparator each time. The feedback circuit includes a digital-to-analog converter (DAC). The DAC is configured to adjust a voltage of the corresponding reference signal Vref according to a potential value of each bit of bits within the sampling cycle which are accumulatively received and bit-by-bit determined. In this way, the comparator can adjust a comparison result output from the comparator each time according to the changed reference signal.

In the adjustment process, the asynchronous operation of the SAR logic circuit includes bit-by-bit logic processing under the control of the delay signal provided by the delay calibration circuit. For example, one or more comparison potentials in the comparison results correspond to one bit outputted. During bit-by-bit processing, the SAR logic circuit performs logic processing on corresponding comparison potential(s) according to an order of bits to be generated at present, to determine a corresponding potential value of each bit of the outputted bits. In some examples, the SAR logic circuit may perform bit-by-bit logic processing in order of bits from the most bit to the least bit, to improve efficiency of the analog-to-digital conversion. The bit-by-bit logic processing includes, for example, quantizing a received comparison result by using a first-order quantizer or a higher-order quantizer.

Figure 2B:
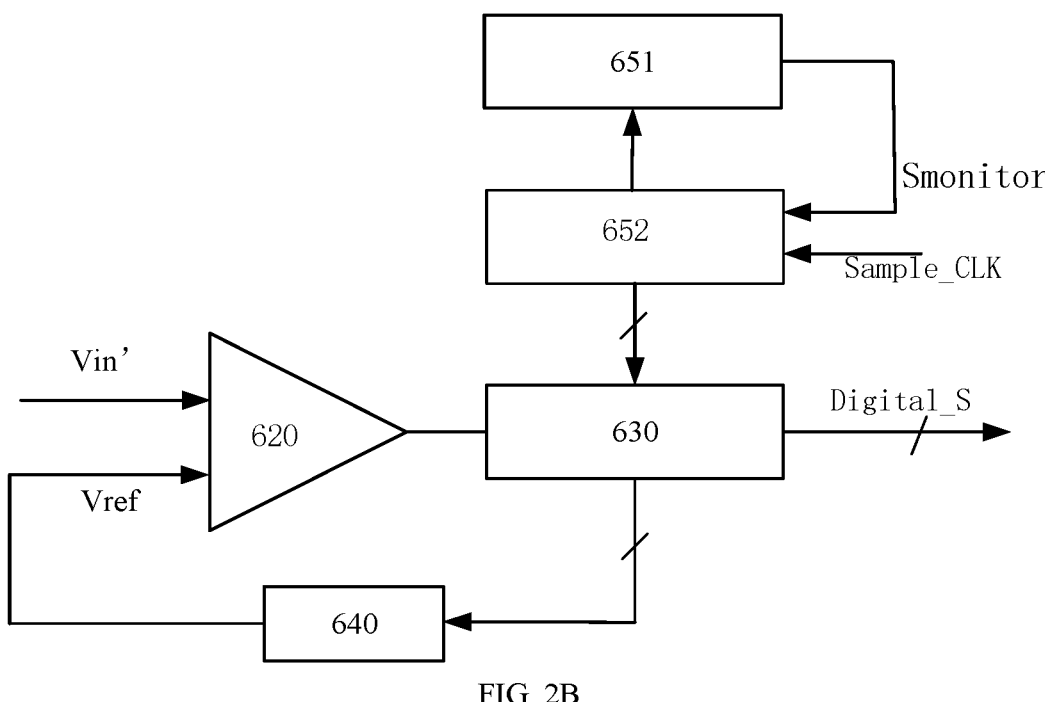

In the delay calibration circuit provided in embodiments of the disclosure, the delay calibration circuit is configured to calibrate a corresponding delay duration of each bit in a next sampling cycle of the SAR ADC. As shown in FIG. 2B, the delay calibration circuit includes a monitoring circuit unit 651 and an adjustable delay calibration circuit unit 652.

The monitoring circuit unit 651 may be configured to receive a delay signal corresponding to each of at least one bit in the present sampling cycle, to monitor a completion time of an analog signal being converted into a digital signal of N bits, and to output a corresponding detection signal $S_{monitor}$ in response to a last bit of the N bits having been generated in the present sampling cycle, where the completion time is represented by the delay signal corresponding to the last bit. The detection signal can be a delay signal corresponding to the last bit, or can also be a voltage signal (or a current signal) triggered in response to the delay signal. For example, the detection signal is a triggering edge at the end of the delay signal corresponding to the last bit, or a square wave signal generated based on the end of the triggering edge.

In some embodiments, the monitoring circuit unit 651 may be coupled (not shown) to the SAR logic circuit 630 to obtain delay signals that cause the SAR logic circuit 630 to perform bit-by-bit conversion within a sampling cycle. The monitoring circuit unit 651 obtains each delay signal of the delay signals. The monitoring circuit unit 651 is configured to count the number of delay signals in one sampling cycle and output a detection signal $S_{monitor}$ when a counting result indicates that an obtained delay signal corresponds to the last bit.

In other embodiments, as shown in FIG. 2B, the monitoring circuit unit 651 is configured to receive a least significant bit (LSB) signal provided by the delay calibration circuit unit 652 and then to directly detect a delay signal corresponding to the LSB.

The adjustable delay calibration circuit unit 652 is coupled with the monitoring circuit unit 651 and is configured to adjust at least one delay duration according to timing information between the detection signal $S_{monitor}$ and a sampling clock signal Sample_CLK of a next sampling cycle. Each delay duration of the at least one delay duration is a length of time spent for the SAR ADC to generate a corresponding bit in the next sampling cycle. The last bit is, for example, the last of bits in the present sampling cycle, and the last bit is determined based on a generation order of the bits in the digital signal by the SAR logic circuit. For example, the last bit is a least bit among the N bits. The timing information is a timing order between a triggering edge of the delay signal of a ready signal of the least bit (i.e., the detection signal) and a triggering edge of the sampling clock signal corresponding to the next sampling cycle.

For example, the monitoring circuit unit is configured to monitor a completion time of the least bit in the present sampling cycle of the SAR ADC, and is configured to be triggered to operate at this time to generate the detection signal. The adjustable delay calibration circuit unit is configured to adjust a delay duration of each of the at least one bit (i.e., at least one delay duration) in the next sampling cycle of the SAR ADC according to the timing information between the received detection signal and the sampling clock signal, to improve the robustness of the asynchronous SAR ADC.

In the delay calibration circuit provided in the present disclosure, due to the different variation amounts of PVT parameters, quantization cannot be carried out. According to embodiments of the present disclosure, the monitoring circuit unit (also called a monitoring circuit) monitors the delay signal corresponding to the least bit of SAR ADC in the present sampling cycle without affecting the normal operation of SAR logic circuit; and generates the detection signal based on the delay signal. The adjustable delay calibration circuit unit (also called an adjustable delay calibration circuit) performs comparison on timing information between the detection signal and the sampling clock signal of the next sampling cycle; and then adjusts adjust the delay duration of each of a plurality of bits in the next sampling cycle of the SAR ADC. In this way, it is possible to improve the robustness of asynchronous SAR ADC while meeting the timing requirements of SAR ADC. In addition, cost and risk are reduced, and the design difficulty is reduced.

Figure 3:
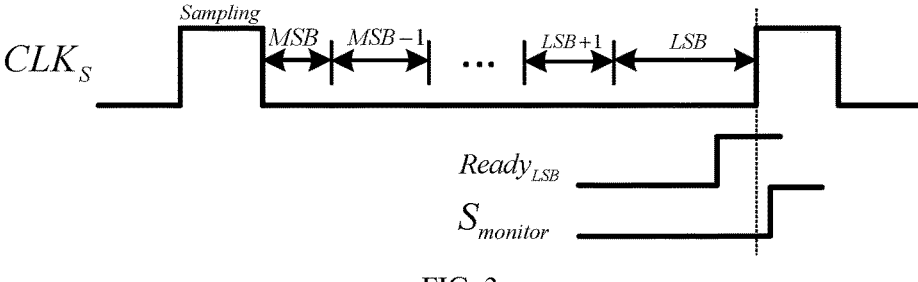
FIG. 3 is a timing diagram of a sampling clock signal and a delay signal according to embodiments of the present disclosure.

Referring to each signal example shown in FIG. 1B, when the precision of the SAR ADC is constant, the delay duration $T_{delay\_n}$ of the n-th comparison process is mainly determined according to at least one of: delay time $T_{cmp}$ of the comparator, delay time $T_{logic}$ of the SAR logic circuit, and the delay time $T_{dac}$ of the DAC. Herein, the monitoring circuit unit may include a circuit module for monitoring the at least one of the above delay times during conversion of the last bit, and/or a circuit module for estimating the at least one of the above delay times during the conversion of the last bit, to obtain the completion time of conversion of the last bit in the present sampling cycle of the SAR ADC. For example, if the delay time $T_{cmp}$ of the comparator is fixed, the monitoring circuit unit can monitor at least one of the delay time $T_{logic}$ and the delay time $T_{dac}$ in the present sampling cycle of the SAR ADC in real time without affecting the normal operation of the SAR logic circuit to determine the completion time of the last bit. More specifically, if the delay time $T_{logic}$ of the SAR logic circuit is also unchanged, the monitoring circuit unit may determine the completion time by monitoring the signal having the delay time $T_{logic}$ and the signal having the delay time $T_{dac}$. As such, the delay calibration circuit designed in the embodiments of the present disclosure adjusts the delay duration $T_{delay}$ of the last bit to correspond to the delay time $T_{dac}$ required by the DAC corresponding to the last bit. As another example, the monitoring circuit unit may determine the delay time $T_{delay}$ for completing the analog-to-digital conversion of the last bit by monitoring a signal generating a delay time $T_{cmp}$ (or end time of a previous bit) and timing, such that the completion time is determined. In this example, the delay calibration circuit designed by the embodiments of the present disclosure adjusts the delay duration $T_{delay}$ of the last bit to correspond to the delay time $(T_{logic}+T_{dac})$ corresponding to the last bit. In order to elaborate the principle of the delay calibration circuit, the following description is made with reference to the timing diagram shown in FIG. 3, where $CLK_s$ is a sampling clock signal, and a sampling cycle of the sampling clock signal $CLK_s$ includes a sampling time period Sampling and a corresponding conversion time period of each bit of a plurality of bits. The corresponding conversion time period of each bit of the plurality of bits is sequentially represented as MSB, MSB−1, . . . , LSB+1, and LSB. As shown in FIG. 3, in the conversion time period corresponding to a most significant bit (MSB) bit, the delay calibration circuit can perform delay timing according to a duration of the sampling time period Sampling; and monitor, starting from a (MSB−1) bit, at least one delay duration $T_{delay\_n}$ in any of the above or other monitoring manners provided in the present disclosure. For example, according to the order of generated bits, MSB is the most bit, LSB is the least bit (that is, the last bit of the bits in a sampling cycle), and a corresponding time period of each bit is controlled by a corresponding delay signal Ready_n. The signal $S_{monitor}$ is a detection signal generated according to an end time of a delay signal $Ready_{LSB}$ corresponding to the LSB bit. The $Ready_{LSB}$ can also represent a signal generated when the comparator outputs the comparison result in the present sampling cycle, and is used by the SAR logic circuit to perform logic processing on the least bit.

Taking FIG. 3 as an example, if an rising edge of the detection signal $S_{monitor}$ is after an rising edge of a next sampling clock signal $CLK_s$, it indicates that an original delay time generated by a plurality of adjustable delay modules 30 is too large, and the adjustable delay calibration circuit unit shortens a delay duration corresponding to a plurality of bits in the next sampling cycle according to a timing order of the rising edge of the detection signal and the rising edge of the next sampling clock signal $CLK_s$. In this way, it is possible to make the ADC not only unnecessary to design more complex circuits, but also improve the robustness of the asynchronous SAR ADC, such that cost and risk may be reduced.

Herein, a configuration and an operation process of the delay calibration circuit unit (that is, the adjustable delay calibration circuit unit referred to in the foregoing text) are described in detail. The delay calibration circuit unit lengthens or shortens a delay duration between delay signals outputted in the next sampling cycle by detecting the timing. For example, the delay calibration circuit unit is configured with an integration circuit to cumulatively adjust a delay duration corresponding to each of delay signals in a corresponding sampling cycle according to a received delay adjustment signal. In another example, the delay calibration circuit unit stores a configuration table of delay duration groups to select delay durations of a corresponding group according to the delay adjustment signal. The delay calibration circuit unit is also configured with an adjustable capacitive device to output a delay signal with the adjusted delay duration.

Figure 2C:
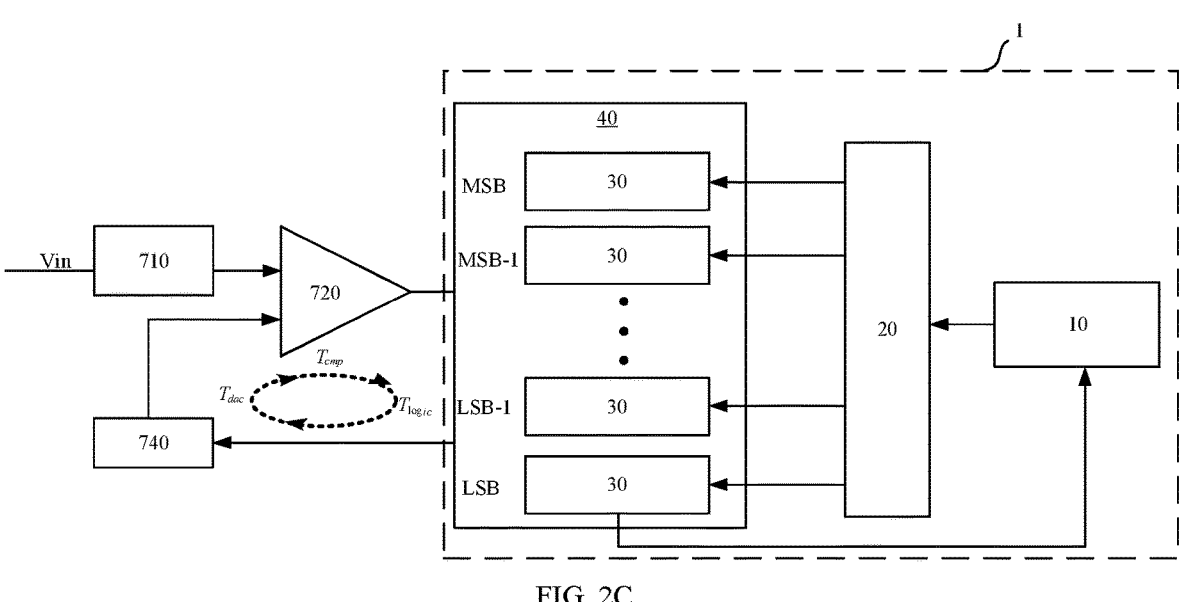

Referring to FIG. 2C, the delay calibration circuit unit 1 includes a plurality of adjustable delay modules 30 and a digital calibration circuit 20. The monitoring circuit unit 10 is connected to an adjustable delay module corresponding to at least the last bit of bits in the SAR logic circuit. The digital calibration circuit 20 is coupled with each of the plurality of adjustable delay modules 30 and the monitoring circuit unit 10. Each unit delay provided by each adjustable delay module 30 may be completely inconsistent, not completely consistent, or completely consistent. The unit delay is a time length between a time at which a single adjustable delay module 30 is triggered to a time at which the single adjustable delay module outputs signals. Each adjustable delay module 30 has an unit delay error due to the process, or provide a different unit delay according to process parameters or internal circuit structures.

In some examples, there may be one or more adjustable delay modules configured for each bit. Each bit of control code corresponds to one adjustable delay module. That is, each adjustable delay module is controlled by one bit of the control code output by the digital calibration circuit. For example, if the number of bits of the control code is M bits, when each bit is configured with more than one adjustable delay module, M corresponds to the number of adjustable delay modules configured for each bit.

Figure 4:
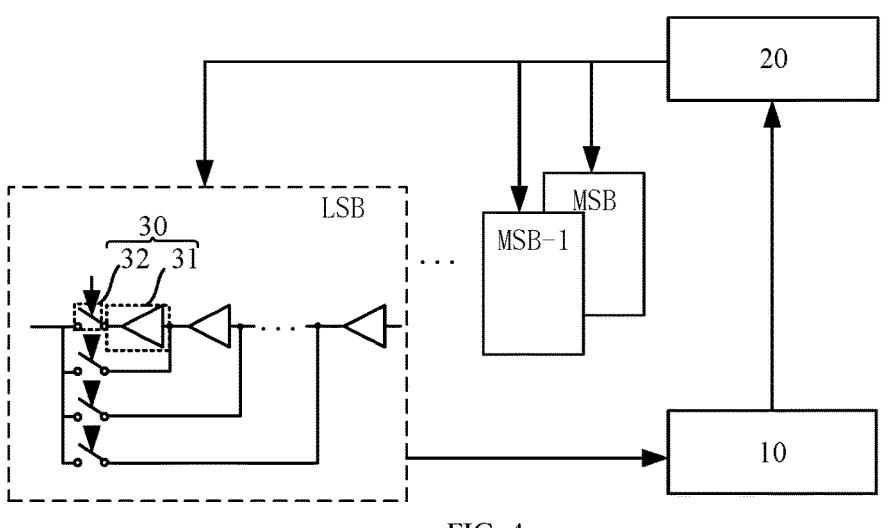
FIG. 4 is a schematic circuit diagram of an ADC according to embodiments of the present disclosure.

For example, FIG. 4 is an example of a configuration in the delay calibration circuit of the present disclosure, in which each bit (MSB, MSB−1, . . . , or LSB) is configured with at least one adjustable delay module 30. In the example of FIG. 4, a delay signal of the last bit (LSB) is output to the monitoring circuit unit 10. A detection signal is generated by the monitoring circuit unit 10 and is output to the digital calibration circuit 20. In an example where the triggering edge corresponding to the end time of the delay signal is used as the detection signal, the monitoring circuit unit 10 may be replaced by a wire.

Figure 5A:
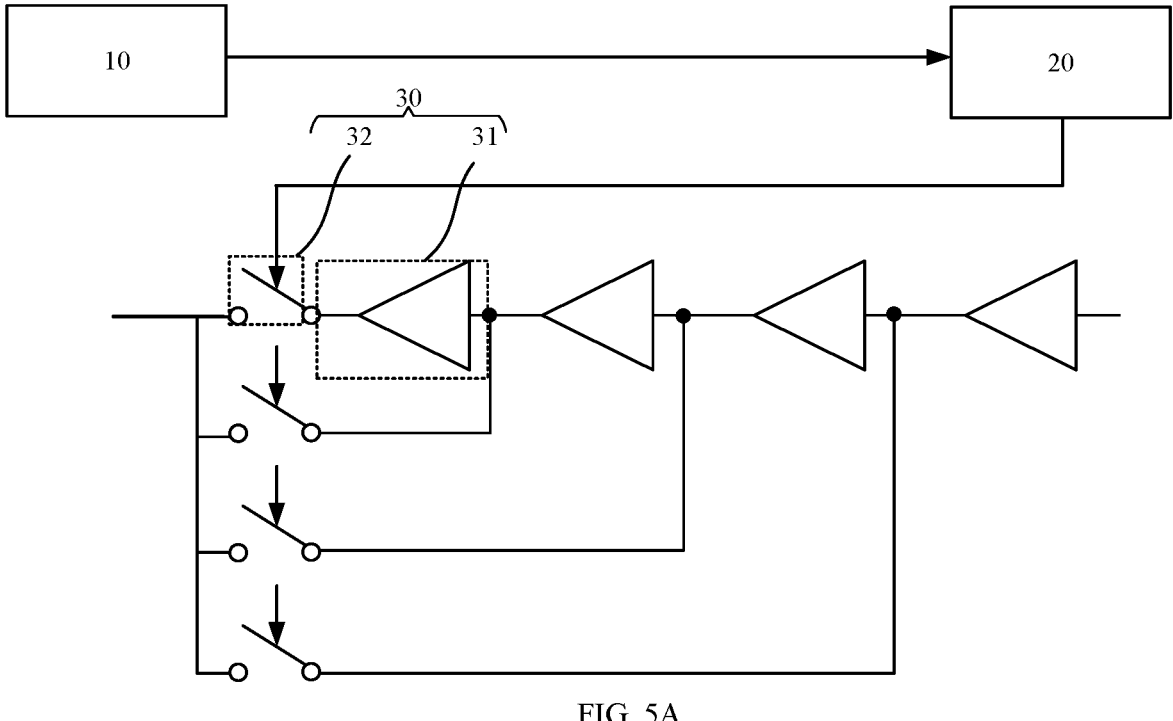
FIG. 5A is a schematic circuit diagram of an adjustable delay module according to embodiments of the present disclosure.

Specifically, as shown in FIG. 5A, each adjustable delay module 30 includes a delay device 31 and a control switch 32 disposed corresponding to the delay device 31. An output terminal of the delay device 31 is connected to a first terminal of the control switch 32, and a control terminal of the control switch 32 is connected to an output terminal of the digital calibration circuit 20. Each control switch 32 in the plurality of adjustable delay modules 30 is configured to control an access number of corresponding delay devices 31 according to the digital control code to adjust a total delay time generated by each of the corresponding delay devices 31. The total delay time corresponds to a delay duration of a corresponding bit. In other words, each control switch can be turned on or off under the control of a codeword signal in a corresponding digital control code. The delay device 31 is for example a buffer.

It is to be noted that the number of adjustable delay modules as shown in FIG. may not be the number illustrated but may also be other numbers. In addition, the number of adjustable delay modules may be redundant preset. According to the requirement of adjusting of the delay duration of each of the corresponding bits, the corresponding number of adjustable delay modules can be flexibly disposed in the delay calibration circuit.

Figure 5B:
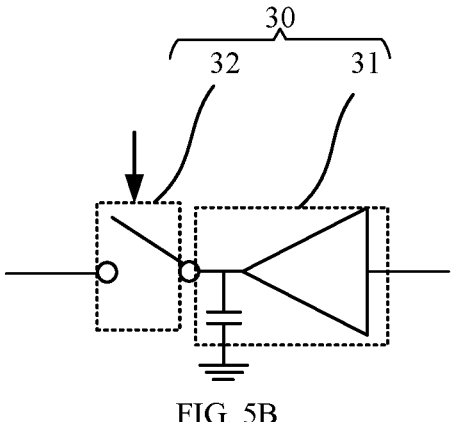
FIG. 5B is a schematic circuit diagram of an adjustable delay module according to other embodiments of the present disclosure.

As another example, referring to FIG. 5B, each of at least part of the delay devices 31 includes a circuit combination of a buffer and a capacitor. In order to provide different delay durations, each delay device 31 in each adjustable delay module 30 can be configured with different electrical parameters, so as to adapt to combinations of unit delays required for different delay durations. In this way, the accuracy of each delay duration can be improved.

As an example, each bit of digit control code is used for controlling an on/off state of a corresponding control switch 32. If the digital control code is a binary code, and each code word representing "1" is used for controlling the corresponding control switch 32 to be in a conduction state, each delay device 31 corresponding to the corresponding control switch 32 does not need to be connected to the delay calibration circuit. Therefore, the adjustable delay modules 30 can provide different delay durations for bits within a sampling cycle.

As shown in FIG. 2C, the digital calibration circuit 20 is connected to each group of adjustable delay modules 30 of a plurality of groups of adjustable delay modules 30 and the monitoring circuit unit 10. The digital calibration circuit 20 is configured to output a digital control code of M bits (an M-bit digital control code) to each group of adjustable delay modules 30 of the plurality of groups of adjustable delay modules 30 according to the timing information between the received detection signal and the sampling clock signal, where M≥1.

The digital calibration circuit 20 is configured to detect the timing information between the triggering edge of the received detection signal and the triggering edge of the sampling clock signal of the next sampling cycle. If it is detected that the triggering edge of the detection signal (a triggering edge of a delay signal of the ready signal of the last bit) is prior to the triggering edge of the sampling clock signal of the next sampling cycle, a delay duration corresponding to each of at least one bit is extended. For example, when the ADC sequentially outputs bits from most bit to least bit, the digital calibration circuit 20 increases a coding value represented by each digital control code on the basis of each digital control code of the present sampling cycle according to a preset delay step, so as to increase the delay duration of each group of at least one group of the plurality of groups of adjustable delay modules 30. The delay step is, for example, one or a preset number of unit delays.

In some examples, each group of adjustable delay modules 30 is configured to receive an M-bit digital control code output from the digital calibration circuit 20. The number of adjustable delay modules of the plurality of groups of adjustable delay modules can be the same or different, and correspondingly, the number of bits of the received digital control code can also be the same or different. For example, the number of adjustable delay modules of a group of adjustable delay modules corresponding to the most bit is less than the number of adjustable delay modules of another group of adjustable delay modules corresponding to the least bit.

It can be understood that FIG. 2C shows an example of a delay calibration circuit including a plurality of groups of adjustable delay modules. In other examples, the delay calibration circuit may include only one group of adjustable delay modules, and the group of adjustable delay modules can be used to adjust a delay duration for each bit in a sampling cycle.

The delay calibration circuit and the ADC provided in embodiments of the disclosure can adjust the delay duration of each bit in the next sampling cycle in real time according to the delay condition in the digital conversion process of the present sampling cycle, thereby achieving the purpose of improving the robustness of the ADC due to the influence of PVT parameter changes.

Figure 6:
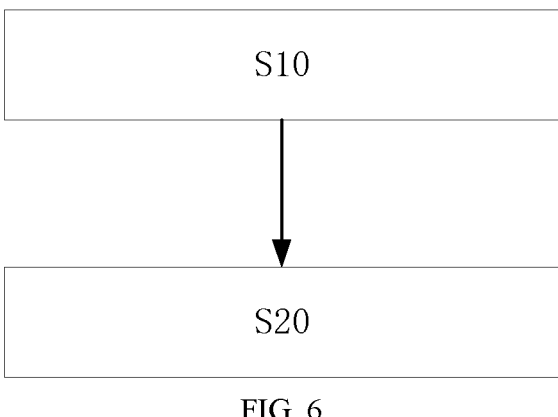
FIG. 6 is a flow chart of a delay calibration method according to embodiments of the present disclosure.

In embodiments of the present disclosure, as shown in FIG. 6, a delay calibration method is also provided. The method is performed by the delay calibration circuit 100 as described above and begins at S10.

At S10, a completion time of an analog signal sampled in a present sampling cycle being converted into a digital signal of N bits is monitored and a detection signal is output in response to a last bit of the N bits having been generated in the present sampling cycle, where N>1.

At S20, at least one delay duration is adjusted according to timing information between the detection signal and a sampling clock signal of a next sampling cycle, where each delay duration of the at least one delay duration corresponds to a length of time spent by the SAR ADC to generate a corresponding bit in the next sampling cycle.

In the delay calibration method provided in embodiments, due to the different variation amounts of PVT parameters, quantization cannot be carried out. According to embodiments of the present disclosure, the monitoring circuit is controlled to monitor the completion time of the least bit of SAR ADC in the present sampling cycle without affecting the normal operation of SAR logic circuit; and generates the detection signal. The digital calibration circuit is controlled to adjust, according to timing information between the detection signal received and the sampling clock signal of the next sampling cycle, each adjustable delay module to adjust the delay duration of each of a plurality of bits in the next sampling cycle of the SAR ADC. In this way, it is possible to meet the timing requirements of SAR ADC and improve the robustness of asynchronous SAR ADC. In addition, cost and risk are reduced, and the design difficulty is reduced.

In some embodiments, the operations at S20 include the following.

At S21, according to a detection result of the timing information, at least one M-bit digital control code is generated for providing a corresponding delay duration for each bit in the next sampling cycle.

At S22, the at least one M-bit digital control code is used to control each adjustable delay module to generate a corresponding delay signal.

The execution of the above operations at S21-S22 (not shown) may be performed for example using the circuits provided in the foregoing examples. Alternatively, based on the signal processing description of the operations at S21-S22, another circuit configuration is selected for executing, which will not be described in detail herein.

The ADC including the delay calibration circuit can be applied to an electrical device that converts an analog signal into a digital signal, such as a signal receiving device, a signal transceiving device, or the like. For example, a signal receiving device including the ADC can more stably convert a received analog signal into a digital signal. For another example, the signal transceiving device can input the received analog signal to the ADC or input other analog signals for testing to the ADC according to an external switching instruction. The signal receiving device, or signal transceiving device, is suitable not only for radar sensors, but also for other radio devices such as mobile phones.

Figure 7:
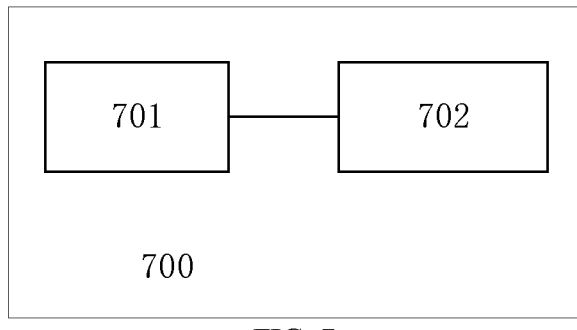
FIG. 7 is a schematic structural diagram of a signal receiving device according to embodiments of the present disclosure.

Referring to FIG. 7, taking a signal receiving device 700 as an example, the signal receiving device includes at least a mixer 701 and an analog-to-digital converter 702. The mixer 701 is configured to mix a radio frequency (RF) receiving signal with a RF reference signal to output an intermediate frequency (IF) signal. The analog-to-digital converter 702 is configured to convert the IF signal into a digital signal and output the digital signal. The analog-to-digital converter (also called ADC) includes the delay calibration circuit provided by any of the above embodiments, so that the ADC can generate a digital signal in a corresponding sampling cycle within at least one sampling cycle based on each delay duration adjusted by the delay calibration circuit.

The mixer is configured to receive a RF reference signal and a RF receiving signal, and perform mixing and filtering on two signals to obtain the IF signal.

Figure 8:
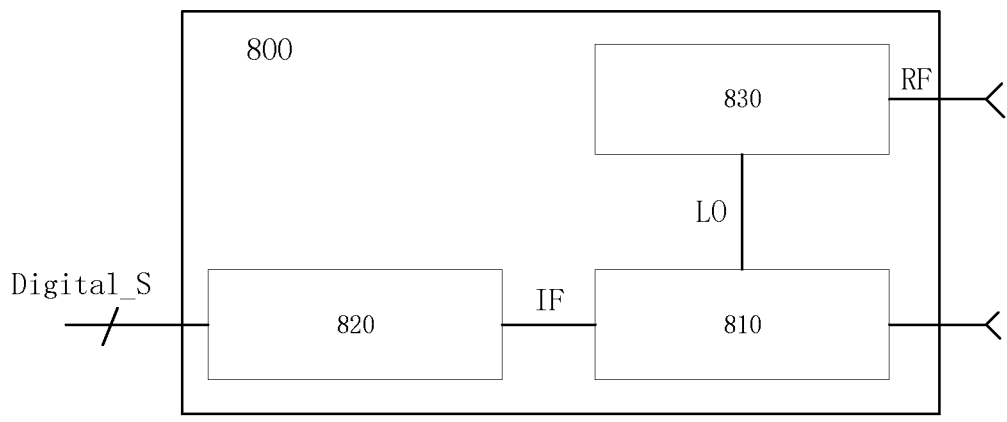
FIG. 8 is a schematic structural diagram of a radar sensor according to embodiments of the present disclosure.

As shown in FIG. 8, taking a radar sensor 800 as an example, in radar sensor 800, a radio RF signal (LO) received by the signal receiving device 810 is coherent with a RF transmitting signal RF. The signal transmitting device 830 in the radar sensor 800 is configured to transmit the generated RF transmitting signal RF to a free space through a transmitting antenna of one transmission link and to the signal receiving device 810 through another transmission link. A mixer in the signal receiving device 810 is configured to convert a radio frequency receiving signal into a signal including an IF signal by using a mixing technique, and retain a part of signal of IF portion through filtering processing or the like to obtain an IF signal IF that can be input to the ADC 820 so as to output a digital signal Digital_S.

In a communication terminal such as a mobile phone, a radio frequency reference signal received by the signal receiving device is a RF signal which is generated based on a local oscillator circuit and does not carry information. The mixer in the signal receiving device outputs an IF signal carrying information through mixing technology and filtering processing.

In some examples, the signal receiving device is also configured with an adaptive amplifier to adjust an energy of the IF signal so that the IF signal received by the ADC is more easily and accurately extracted.

Figure 9:
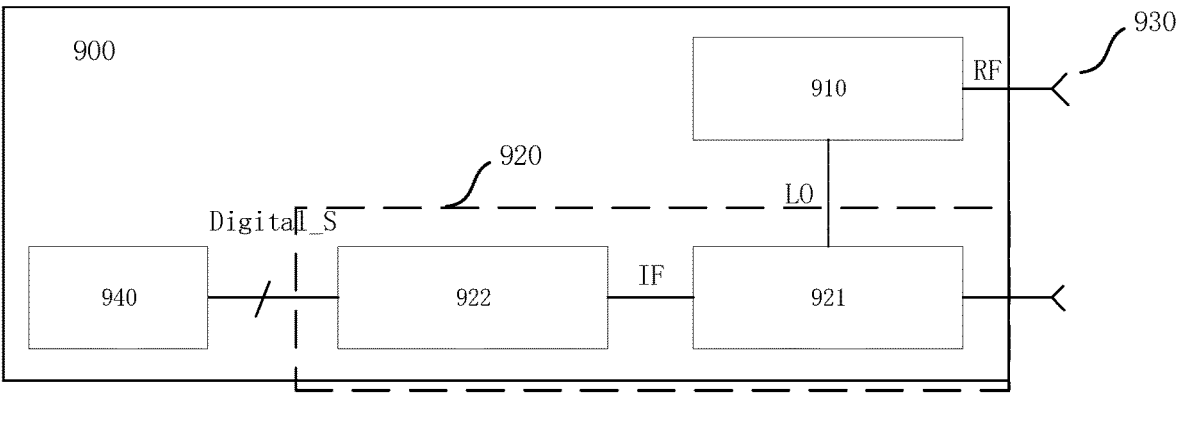
FIG. 9 is a schematic structural diagram of an electronic device according to embodiments of the present disclosure.

The ADC is configured to convert the received IF signal into a digital signal to obtain a baseband digital signal (BB). The baseband digital signal is used for digital processing by subsequent circuits. For example, as shown in FIG. 9, in the radar sensor 900, the signal processing device 940 performs at least one signal processing of fast Fourier transform (FFT), 2FFT, and angle FFT on the baseband digital signal to obtain measurement information of the radar sensor on the surrounding object. In another example, in a communication terminal such as a mobile phone, the signal processing device extracts information carried by a baseband digital signal by demodulating and decoding the baseband digital signal.

The ADC 820 may be a SAR ADC as described in any of the above examples or other analog-to-digital converters each that include the delay calibration circuit in the examples of the present disclosure, which are not described in detail herein.

Embodiments of the disclosure also provides a radar sensor. The radar sensor is configured to detect measurement information between the radar sensor and objects in the surrounding environment. The measurement information includes, for example, at least one of a distance, a relative velocity, and an angle, and the like.

Still referring to FIG. 9, the radar sensor 900 includes an antenna device 930, a signal transmitting device 910, and a signal receiving device 920.

The antenna device 930 includes a transmitting antenna and a receiving antenna.

The signal transmitting device 910 is coupled to the transmitting antenna, and is configured to process a reference signal (also called RF reference signal) generated by a signal source into a RF transmitting signal, and to transmit the RF transmitting signal through the transmitting antenna. The reference signal is, for example, a sinusoidal signal.

Specifically, the signal transmitting device 910 is configured to perform frequency modulation/phase modulation processing on the reference electrical signal to modulate the reference electrical signal into a RF transmitting signal in a radio frequency band and output the radio frequency transmitting signal to a transmitting antenna. For example, the signal transmitting device 910 is configured to modulate the reference signal to a radio frequency and feeds the radio frequency signal to the transmitting antenna so that the transmitting antenna generates a probe signal wave with a center frequency in a frequency band such as 64 GHz or 77 GHz. The signal transmitting device can generate a detection signal wave whose center frequency is a fixed frequency, or a detection signal wave whose frequency is swept by the center frequency and a preset bandwidth. Taking the detection signal wave including at least one chirp signal as an example, the chirp signal is an electromagnetic wave signal formed based on a linear frequency modulation period, the signal transmitting device 910 is configured to perform frequency doubling processing based on a signal source of the linear frequency modulation period and feeds the signal subjected to frequency doubling processing to a transmitting antenna to transmit the detection signal wave including the chirp signal.

When the detection signal wave is reflected by the object, an echo signal wave is formed. The receiving antenna generates a radio frequency receiving signal by receiving the echo signal wave.

The signal receiving device 920 includes a mixer 921 and a mode converter 922. The mixer 921 in the signal receiving device 920 is configured to perform frequency reduction, filtering and the like on a radio frequency receiving signal output from a receiving antenna using a radio frequency reference transmitting signal (LO); and using an ADC (e.g., 922) as mentioned in this disclosure to output a digital signal. Therefore, the radar sensor can effectively reduce the error rate of the baseband digital signal due to PVT factors, so that the radar sensor can more accurately reflect the sampled analog signal.

Embodiments of the disclosure also provide an electronic device configured with the radar sensor. The signal processing device 940 shown in FIG. 9 may be configured in the electronic device and configured to perform signal processing according to the digital signal output by the ADC 922 to perform target detection on the surrounding environment.

The signal processing device 940 is connected to the signal receiving device 920 and configured to extract measurement information from the digital signal by signal processing and output the measurement information. The signal processing includes carrying out digital signal processing calculation such as phase, frequency, time domain, etc. on at least one signal to be processed provided by at least one receiving antenna. The measurement information includes at least one of: distance data indicative of a relative distance of the detected at least one obstacle, velocity data indicative of the relative velocity of the detected at least one obstacle, and angle data for indicating the relative angle of the detected at least one obstacle.

In an alternative embodiment, the electronic devices may be components and products applied to fields such as smart homes, transportation, smart homes, consumer electronics, monitoring, industrial automation, in-cabin detection, and health care. For example, the electronic devices can be intelligent transportation devices (such as automobiles, bicycles, motorcycles, ships, subways, trains, etc.), security devices (such as cameras), liquid level/flow rate detection equipment, smart wearable devices (such as bracelets, glasses, etc.), smart home devices (such as sweeping robots, door locks, televisions, air conditioners, smart lights, etc.), various communication devices (such as mobile phones, tablet computers, etc.), as well as road gates, intelligent traffic lights, intelligent signs, traffic cameras and various industrial mechanical arms (or robots), etc. It can also be various instruments for detecting vital parameters and various devices equipped with the instrument, such as automobile cabin detection, indoor personnel monitoring, intelligent medical equipment, consumer electronic devices, etc.

In yet another alternative embodiment, when the above-mentioned electronic equipment is applied to an advanced driving assistance system (i.e., ADAS), a radar sensor (e.g., millimeter wave radar) as a vehicle-mounted sensor can provide a detection function for the ADAS system to safely provide measurement information for various functions such as automatic brake assistance (i.e., AEB), blind spot detection warning (i.e., BSD), auxiliary lane change warning (i.e., LCA), reverse assistance warning (i.e., RCTA), etc.

The technical features of the above-described embodiments may be arbitrarily combined, and all possible combinations of the technical features of the above-described embodiments have not been described in order to make the description concise. However, they should be considered as the scope described in this specification, as long as there is no contradiction in the combinations of these technical features.

The above-described embodiments are merely illustrative of several embodiments of the present disclosure and the description thereof is more specific and detailed but is not therefore to be construed as limiting the scope of the present disclosure. It is to be noted that various modifications and changes may be made to those of ordinary skill in the art without departing from the concept of the present disclosure, which fall within the scope of protection of the present disclosure. Therefore, the scope of protection of this disclosure shall be subject to the attached claims.

Reference numerals in figures are illustrated as follows:

410, 710 sample-and-hold circuit
420, 520, 620, 720 comparator
430, 530, 630 SAR logic circuit
440, 540, 640, 740 feedback circuit
550 delay calibration circuit
651 monitoring circuit unit
652 adjustable delay calibration circuit unit
1 delay calibration circuit unit
10 monitoring circuit unit
20 digital calibration circuit
30 adjustable delay module
40 adjustable delay calibration circuit unit
31 delay device
32 control switch
S10 monitor a completion time of an analog signal sampled in a present sampling cycle being converted into a digital signal of N bits, and output a detection signal
S20 adjust at least one delay duration according to timing information between the detection signal and a sampling clock signal of a next sampling cycle
700 signal receiving device
701 mixer
702 analog-to-digital converter
800 radar sensor
810 signal receiving device
820 analog-to-digital converter
830 signal transmitting device
900 radar sensor
910 signal transmitting device
920 signal receiving device
921 mixer
922 mode converter
930 antenna device
940 signal processing device

What is claimed is:

1. A delay calibration circuit, arranged within a successive approximation register (SAR) analog-to-digital converter (ADC), wherein the SAR ADC is configured to convert an analog signal sampled in a present sampling cycle into a digital signal of N bits, N>1; wherein the delay calibration circuit comprises:

a monitoring circuit, configured to monitor a completion time of the analog signal being converted in the present sampling cycle and to output a detection signal in response to a last bit of the N bits having been generated in the present sampling cycle; and an adjustable delay calibration circuit coupled with the monitoring circuit and configured to adjust at least one delay duration according to timing information between the detection signal and a sampling clock signal of a next sampling cycle, wherein each delay duration of the at least one delay duration corresponds to a respective length of time spent by the SAR ADC to generate a respective bit of the N bits in the next sampling cycle;

wherein the adjustable delay calibration circuit comprises:

a plurality of adjustable delay modules, wherein the each delay duration for the respective bit is adjusted using at least one respective adjustable delay module of the plurality of adjustable delay modules; and a digital calibration circuit coupled with each adjustable delay module of the plurality of adjustable delay modules and the monitoring circuit, and configured to receive the detection signal and the sampling clock signal, to generate an M-bit digital control code for the respective bit of the N bits according to the timing information, and to output the M-bit digital control code to the at least one respective adjustable delay module, and wherein M is greater than or equal to 1 and is equal to a number of the at least one respective adjustable delay module.

2. The delay calibration circuit of claim 1, wherein the timing information is a timing order between a triggering edge of a delay signal of a ready signal of the least bit and a triggering edge of the sampling clock signal corresponding to the next sampling cycle.

3. The delay calibration circuit of claim 2, wherein the adjustable delay calibration circuit is configured to extend the at least one delay duration in response to the triggering edge of a delay signal of a ready signal of the last bit being prior to the triggering edge of the sampling clock signal of the next sampling cycle.

4. The delay calibration circuit of claim 1, wherein each adjustable delay module comprises a delay device and a control switch coupled with the delay device, and wherein the control switch is configured to be turned on or off under the control of a codeword signal in a corresponding digital control code.

5. The delay calibration circuit of claim 1, wherein the plurality of adjustable delay modules provide unit delays, and wherein at least some of the unit delays are different from each other.

6. The delay calibration circuit of claim 5, wherein each unit delay is a time length between a time at which a single adjustable delay module is triggered to a time at which the single adjustable delay module outputs signals.

7. The delay calibration circuit of claim 1, wherein the plurality of adjustable delay modules are grouped into a plurality of groups of adjustable delay modules according to the number of bits of the N bits, and at least one respective adjustable delay module in each group of adjustable delay modules is configured to receive a corresponding M-bit digital control code.

8. The delay calibration circuit of claim 7, wherein the plurality of groups of adjustable delay modules each include a same number of adjustable delay modules or different groups of the plurality of groups of adjustable delay modules include different numbers of adjustable delay modules.

9. An analog-to-digital converter (ADC), configured to convert an analog signal received in a present sampling cycle into a digital signal, wherein the ADC comprises:

the delay calibration circuit of claim 1 configured to adjust a corresponding duration spent for generating each bit of a digital signal in a next sampling cycle.

10. The ADC of claim 9, further comprising:

a comparator configured to receive the analog signal and a reference signal, and to compare potential values of the analog signal and the reference signal in the present sampling cycle to output a comparison result;

a SAR logic circuit coupled with an output terminal of the comparator, and configured to perform logic processing on the comparison result within a corresponding delay duration set by the delay calibration circuit to output each bit of the digital signal corresponding to the analog signal; and a feedback circuit coupled with an output terminal of the SAR logic circuit and a reference signal input terminal of the comparator, and is configured to convert the each bit of the digital signal into the reference signal.

11. The ADC of claim 9, wherein the adjustable delay calibration circuit comprises:

a plurality of adjustable delay modules for adjusting each delay duration; and a digital calibration circuit coupled with each adjustable delay module and the monitoring circuit, and configured to receive the detection signal and the sampling clock signal, to generate at least one M-bit digital control code for the N bits according to the timing information between the received detection signal and the sampling clock signal, and to output each M-bit digital control code to corresponding adjustable delay modules, and wherein M≥1.

12. The ADC of claim 11, wherein each adjustable delay module comprises a delay device and a control switch coupled with the delay device, and wherein the control switch is configured to be turned on or off under the control of a codeword signal in a corresponding digital control code.

13. The ADC of claim 11, wherein the plurality of adjustable delay modules are grouped into a plurality of groups of adjustable delay modules according to the number of bits of the N bits, and at least one adjustable delay module in each group of adjustable delay modules is configured to receive a corresponding M-bit digital control code.

14. The ADC of claim 9, wherein the timing information is a timing order between a triggering edge of a delay signal of a ready signal of the last bit and a triggering edge of the sampling clock signal corresponding to the next sampling cycle.

15. A signal receiving device, comprising:

a mixer configured to mix a radio frequency receiving signal with a radio frequency reference signal to output an intermediate frequency signal; and an analog-to-digital converter (ADC) configured to convert the intermediate frequency signal into a digital signal and to output the digital signal, wherein the ADC comprises the delay calibration circuit of claim 1 configured to generate a digital signal in a corresponding sampling cycle based on each delay duration adjusted by the delay calibration circuit within at least one sampling cycle.

16. A radar sensor, comprising:

an antenna device comprising a transmitting antenna and a receiving antenna;

a signal transmitting device configured to process a reference signal generated by a signal source into a radio frequency transmitting signal and to transmit the radio frequency transmitting signal through the transmitting antenna; and the signal receiving device of claim 15, wherein the radio frequency receiving signal received by the signal receiving device is obtained after an electromagnetic wave emitted by the transmitting antenna is reflected by an object and converted by the receiving antenna.

17. An electronic device, comprising:

the radar sensor of claim 16; and a signal processing device coupled to the radar sensor, and configured to perform signal processing on a digital signal output from the radar sensor, to detect targets in a surrounding environment.

18. The delay calibration circuit of claim 1, wherein the adjustable delay calibration circuit is configured to shorten each delay duration of the at least one delay duration in response to a rising edge of the detection signal being after a rising edge of the sampling clock signal of the next sampling cycle, and to extend each delay duration of the at least one delay duration in response to a triggering edge of the detection signal being prior to a triggering edge of the sampling clock signal of the next sampling cycle.

19. The delay calibration circuit of claim 1, wherein the plurality of adjustable delay modules provide unit delays, and wherein at least some of the unit delays are equal.

20. A delay calibration method, comprising:

monitoring a completion time of an analog signal sampled in a present sampling cycle and being converted into a digital signal of N bits, wherein N>1;

outputting a detection signal in response to a last bit of the N bits having been generated in the present sampling cycle; and adjusting at least one delay duration according to timing information between the detection signal and a sampling clock signal of a next sampling cycle, wherein each delay duration of the at least one delay duration corresponds to a respective length of time spent by the SAR analog-to-digital converter (ADC) to generate a respective bit of the N bits in the next sampling cycle;

wherein adjusting the at least one delay duration according to the timing information between the detection signal and the sampling clock signal of the next sampling cycle, comprises:

generating an M-bit digital control code for the respective bit of the N bits in the next sampling cycle according to a detection result of the timing information;

outputting the M-bit digital control code to at least one corresponding adjustable delay module of a plurality of adjustable delay modules, wherein the at least one corresponding adjustable delay module is configured to adjust a delay duration of the at least one delay duration for the respective bit of the N bits; and adjusting the delay duration of the at least one delay duration using the at least one corresponding adjustable delay module and the M-bit digital control code, wherein M is greater than or equal to 1 and is equal to a number of the at least one respective adjustable delay module.

* * * * *